(12) United States Patent
Poirier et al.

(10) Patent No.: US 9,024,394 B2
(45) Date of Patent: May 5, 2015

(54) CONTROLLED TRANSFORMATION OF NON-TRANSIENT ELECTRONICS

(71) Applicant: Transient Electronics, Inc., Waltham, MA (US)

(72) Inventors: Christopher Poirier, Wellesley, MA (US); Anthony Stewart Campbell, Framingham, MA (US); Carmichael S. Roberts, Brookline, MA (US); John A. Rogers, Champaign, IL (US); Winston E. Henderson, Waltham, MA (US)

(73) Assignee: Transient Electronics, Inc., Waltham, MA (US)

( * ) Notice: Subject to any disclaimer, the term of this patent is extended or adjusted under 35 U.S.C. 154(b) by 0 days.

(21) Appl. No.: 14/283,390

(22) Filed: May 21, 2014

(65) Prior Publication Data

US 2014/0347120 A1    Nov. 27, 2014

Related U.S. Application Data

(60) Provisional application No. 61/826,371, filed on May 22, 2013.

(51) Int. Cl.
*H05B 3/06* (2006.01)
*B02C 23/00* (2006.01)
*H05K 1/02* (2006.01)
*H01L 21/70* (2006.01)

(52) U.S. Cl.
CPC *H05B 3/06* (2013.01); *B02C 23/00* (2013.01); *H01L 21/70* (2013.01); *H05K 1/0275* (2013.01)

(58) Field of Classification Search
None
See application file for complete search history.

(56) References Cited

U.S. PATENT DOCUMENTS

| | | | |
|---|---|---|---|
| 3,882,324 | A | 5/1975 | Smolker et al. |
| 5,108,755 | A | 4/1992 | Daniels et al. |
| 5,184,284 | A | 2/1993 | Ashelin et al. |
| 5,334,866 | A | 8/1994 | Kubo |
| 6,123,861 | A | 9/2000 | Santini, Jr. et al. |
| 6,527,762 | B1 | 3/2003 | Santini, Jr. et al. |
| 6,534,270 | B2 | 3/2003 | Kim et al. |
| 6,773,429 | B2 | 8/2004 | Sheppard, Jr. et al. |
| 6,801,420 | B2 | 10/2004 | Talbot et al. |
| 6,973,718 | B2 | 12/2005 | Sheppard, Jr. et al. |
| 7,187,528 | B2 | 3/2007 | Talbot et al. |

(Continued)

FOREIGN PATENT DOCUMENTS

| | | |
|---|---|---|
| CN | 101859749 A | 10/2010 |
| DE | 19748173 A1 | 5/1999 |

(Continued)

OTHER PUBLICATIONS

International Search Report and Written Opinion mailed on Oct. 20, 2014, for International Patent Application No. PCT/US2014/038900, filed May 21, 2014 (10 pages).

*Primary Examiner* — Seahvosh Nikmanesh
(74) *Attorney, Agent, or Firm* — Brown Rudnick LLP

(57) ABSTRACT

Systems and methods of the invention generally relate to altering the functionality of a non-transient electronic device. A container holding an agent is located proximal to a non-transient electronic device capable of performing at least one function. The agent is capable of rendering the device incapable of performing the at least one function. The container is configured to controllably release the agent to the electronic device in a variety of passive and active eventualities.

32 Claims, 8 Drawing Sheets

(56) References Cited

U.S. PATENT DOCUMENTS

| | | |
|---|---|---|
| 7,371,400 B2 | 5/2008 | Borenstein et al. |
| 7,460,350 B2 | 12/2008 | Talbot et al. |
| 7,473,248 B2 | 1/2009 | Santini, Jr. et al. |
| 7,537,590 B2 | 5/2009 | Santini, Jr. et al. |
| 7,573,062 B2 | 8/2009 | Hirai |
| 7,599,737 B2 | 10/2009 | Yomtov et al. |
| 7,604,628 B2 | 10/2009 | Santini, Jr. et al. |
| 7,760,481 B2 | 7/2010 | Talbot et al. |
| 8,016,817 B2 | 9/2011 | Santini, Jr. et al. |
| 8,288,857 B2 | 10/2012 | Das et al. |
| 8,403,915 B2 | 3/2013 | Santini, Jr. et al. |
| 2002/0182241 A1 | 12/2002 | Borenstein et al. |
| 2003/0201560 A1 | 10/2003 | Vollrath et al. |
| 2005/0230767 A1 | 10/2005 | Park et al. |
| 2006/0229735 A1 | 10/2006 | Roy et al. |
| 2007/0015190 A1 | 1/2007 | Lai |
| 2007/0108384 A1 | 5/2007 | Mueller et al. |
| 2007/0123973 A1 | 5/2007 | Roth et al. |
| 2007/0179599 A1 | 8/2007 | Brodbeck et al. |
| 2007/0187862 A1 | 8/2007 | Kaplan et al. |
| 2007/0212730 A1 | 9/2007 | Vepari et al. |
| 2009/0079055 A1 | 3/2009 | Oh et al. |
| 2009/0112188 A1 | 4/2009 | Santini, Jr. et al. |
| 2009/0234214 A1 | 9/2009 | Santini, Jr. et al. |
| 2010/0023071 A1 | 1/2010 | Yomtov et al. |
| 2012/0223293 A1 | 9/2012 | Borenstein et al. |
| 2012/0305303 A1 | 12/2012 | Hossain et al. |
| 2013/0140649 A1 | 6/2013 | Rogers et al. |

FOREIGN PATENT DOCUMENTS

| | | |
|---|---|---|
| DE | 10-2004-008319 A1 | 9/2005 |
| EP | 1498456 A1 | 1/2005 |
| EP | 1511096 A2 | 3/2005 |
| EP | 1609801 A1 | 12/2005 |
| JP | 2006186294 A | 7/2006 |
| WO | 0230401 A2 | 4/2002 |
| WO | 02096389 A1 | 12/2002 |
| WO | 03030194 A1 | 4/2003 |
| WO | 2006104069 A1 | 10/2006 |
| WO | 2006108684 A1 | 10/2006 |
| WO | 2007016524 A2 | 2/2007 |
| WO | 2007141131 A1 | 12/2007 |

CONTROLLED TRANSFORMATION OF NON-TRANSIENT ELECTRONICS

CROSS-REFERENCE RELATED APPLICATIONS

This application claims the benefit of and priority to Provisional U.S. Patent Application Ser. No. 61/826,371, which was filed on May 22, 2013, the entirety of which is incorporated by reference herein.

TECHNICAL FIELD

The invention generally relates to transient electronic devices.

BACKGROUND INFORMATION

Modern electronics are often manufactured from electrical conductors (e.g., copper) and semiconductors, primarily silicon. Semiconductor materials such as silicon have enabled construction of the complicated integrated circuits that make up the electronic devices ubiquitous in today's society. Through established semiconductor fabrication procedures billions of transistors and other electronic components can be integrated into a single microchip. One of the notable properties of silicon, and therefore these electronic devices, is physical durability.

Biodegradable electronics based on organic materials are known. See, for example, Published U.S. Patent Application No. US 2012/0223293 A1. Such devices use carbon-based electrical semiconductors and/or conductors including various conductive polymers. These organic devices can be lighter and more flexible than traditional inorganic conductors (e.g., copper) and semiconductors (e.g., silicon) but have not reached the performance levels of traditional non-organic materials and cannot be formed using the established techniques and equipment of semiconductor fabrication. Transient devices that require specialized fabrication techniques to create from traditional semiconductors such as silicon and conductor materials such as magnesium also are known. See, for example, U.S. Patent Application No. US 2013/0140649 A1.

SUMMARY OF THE INVENTION

The present invention generally relates to making transient devices and systems from traditionally-fabricated non-transient electronic devices. Systems and methods of the invention are directed to controllably altering the functionality of non-transient electronic devices through physical alteration of those devices. One objective of the invention is to take a conventional (i.e., non-transient) commercial off-the-shelf electronic device that is capable of performing at least one function and controllably rendering the device no longer capable of performing that function. Another objective of these systems and methods is to enable multiple modes of initiating the transformation of non-transient electronic devices. These transformations may be active or passive and may be pre-programmed, time dependent, remotely triggered, or in response to an external stimulus (e.g., vibration, light, or temperature changes).

Systems and methods of the present invention generally comprise a non-transient electronic device such as an electronic memory storage device or microprocessor, an agent capable of rendering the electronic device inoperable, a container to hold the agent, and a means of releasing the agent to the device. The container may be a variety of shapes and sizes and may generally conform to the shape and size of the electronic device. The container is positioned relative to the electronic device so that agent released from the container may physically interact with the electronic device. To this end, the container may for example surround the electronic device, be positioned within a layer above or below the electronic device, or be incorporated into a layer of the electronic device. The system can employ a single container or multiple containers. Containers may be strategically positioned in order to act only on specific portions of the electronic device and thereby alter specific functions of the device while leaving others unaffected.

The agent can be, for example, a chemical etchant with a low or high pH or an oxidizing agent. The specific agent can be determined to suit the electronic device to which it is paired in the system based on the material properties of the device. For example, the electronic device may comprise a semiconductor material such as silicon and the agent can be a chemical etchant such as hydrofluoric acid.

Release of the agent may be triggered by, among other things, heat applied to the container or the agent within the container, radiation applied to the container, or mechanical force applied to the container. In some embodiments, the agent or the container may be heated through the application of radiofrequency (RF) energy. In some cases, the system may include a receiver allowing for remote release of the agent, for instance, through remote activation of a transducer to provide RF energy to the container of the agent. Additionally, the container may be constructed of a material designed to degrade over time thereby releasing the agent after a predetermined amount of time. The system may include one or more different sensors which can trigger release of the agent in response to a change in the external environment around the electronic device.

Methods of the invention relate to constructing a system configured to controllably alter the functionality of non-transient electronic devices through physical alteration of those devices.

DESCRIPTION

Figure 1:
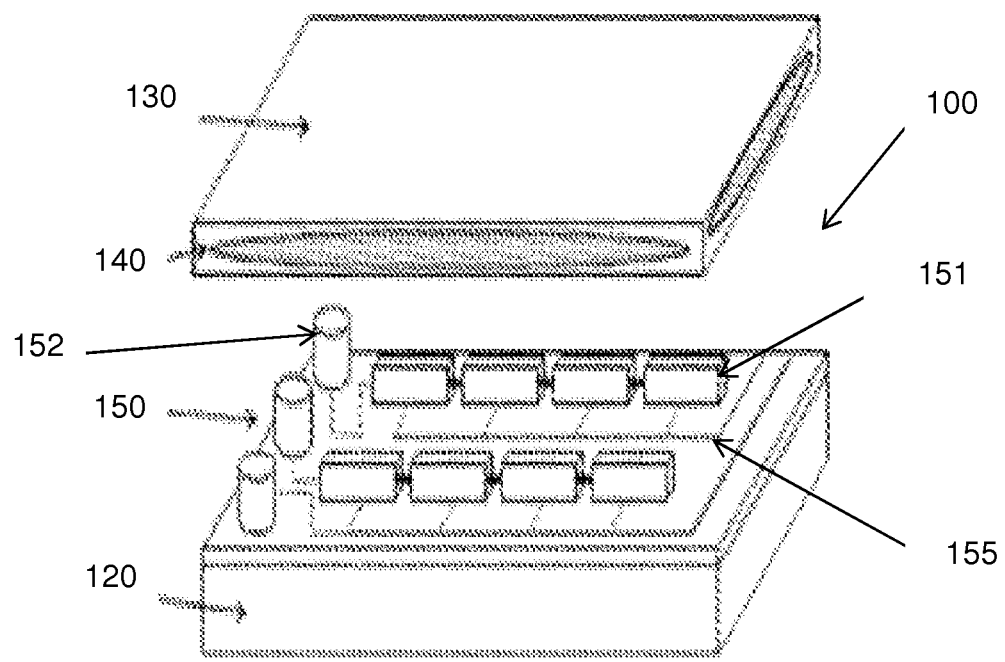
FIG. 1 shows an exploded perspective view of a system of the present invention with an ellipse shaped container located in a layer above a non-transient electronic device.

Systems and methods according to the invention relate to changing the functionality of one or more non-transient electronic devices via the controlled release of an agent from one or more containers. A non-transient electronic device of a system according to the invention may be a variety of electronic or microelectronic devices and may comprise inorganic electronic conductors and semiconductors. In certain embodiments, the non-transient electronic device may be a commercial off-the-shelf electronic device. Systems and methods of the invention are primarily directed toward standard electronic commercial off-the-shelf electronic devices. This is in sharp contrast to transient devices that are created specifically to undergo transformation such as the transient devices described in Published U.S. Patent Application No. US 2013/0140649 A1.

In preferred embodiments, the non-transient electronic device comprises a semiconductor material such as silicon or germanium and a conductor material such as copper. The majority of electronic and microelectronic devices produced and used today are composed of these materials. An advantage of the present invention is its compatibility with existing electronic device technology and production techniques. The current semiconductor device fabrication process is a multiple-step sequence of photolithographic and chemical processing steps during which the device is gradually created on a wafer made of pure semiconducting material, most often silicon. Semiconductor fabrication requires many expensive pieces of equipment and a specialized clean room environment. Deviation from these established fabrication techniques would be expensive and inefficient. The current invention can utilize the existing infrastructure without requiring significant or costly alterations to the established semiconductor fabrication processes.

A non-transient electronic device according to the invention may be an integrated circuit consisting of millions or billions of microelectronic components such as transistors, capacitors, inductors, resistors, and/or diodes. Examples of non-transient electronic devices include a RAM chip or other volatile memory chip, a microprocessor or other type of central processing unit, or an application specific integrated circuit (ASIC).

In certain embodiments, the non-transient electronic device may be an integrated circuit with a semiconductor (e.g., silicon) bottom support or substrate and microelectronic components formed above that substrate by the various semiconductor device fabrication process steps. These steps may include doping the semiconductor substrate to change the electrical properties of certain areas, etching the substrate to remove material from selected areas, and depositing material onto the substrate. These processes are often guided by patterns transferred to the substrate through photolithography.

Non-transient electronic devices of the invention are capable of performing at least one function. That function may be, for example, storing data, processing data or instructions, or sensing a parameter or factor of an environment. As noted earlier, systems and methods of the invention relate to altering the functionality of the non-transient electronic device. Examples of functional changes include rendering the non-transient electronic device completely inoperable; partially inoperable, or unrecognizable and inoperable, enabling new functions, or any combination thereof. In addition to these functional changes, agents of the invention may physically alter the non-transient electronic device to make it unrecognizable or completely dissolved.

Container or containers of the invention are configured to controllably release at least some of a contained agent to the non-transient electronic device. In systems and methods of the invention, one or more containers are positioned so that an agent released from the one or more containers can physically contact the non-transient electronic device.

FIG. 1 illustrates an exploded perspective view of a system 100 of the invention. Methods of the invention may be used to construct any of the systems depicted in FIGS. 1-8 as well as any systems described herein. With reference to the embodiment depicted in FIG. 1, a non-transient electronic device 150 comprises multiple discrete or integrated electronic components including transistors 152, and diodes 151 on a semiconductor bottom support or substrate 120 which are interconnected via channels of a conductor material 155. Transistors 152 and diodes 151 are shown as examples but any discrete electronic component or integrated circuit element (e.g., resistors, capacitors, transducers, or sensors) may be included in a non-transient electronic device of a system or method of the invention. For ease of illustration the discrete electronic components in FIGS. 1-8 have been enlarged however systems and methods of the invention also contemplate non-transient electronic devices 150 such as integrated circuits with incorporated transistors and components. In the embodiment shown in FIG. 1, a single container 140 in an ellipsoid shape is disposed in a layer 130 positioned above the non-transient electronic device 150. A cutaway of the layer 130 is shown in FIG. 1 so that the container 140 within may be seen. The container 140 may be partially or fully contained within a layer 130. FIG. 1 further illustrates positioning of a non-transient electronic device 150 and a container 140 including an agent according to a method of the invention.

Figure 2:
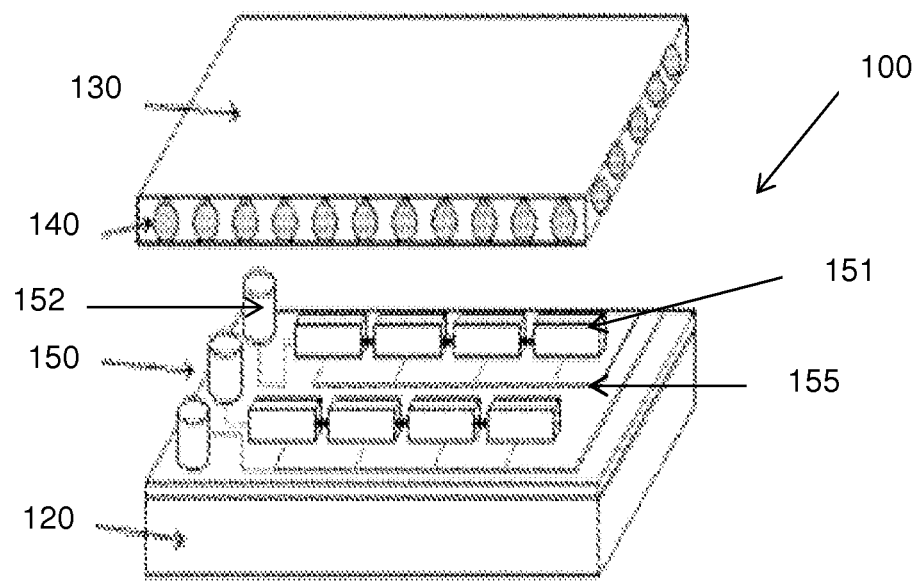
FIG. 2 shows an exploded perspective view of a system of the present invention with several microcapsule containers located in a layer above a non-transient electronic device.

Moving to FIG. 2, an embodiment of a system 100 of the invention is shown wherein multiple containers 140 of a microspherical shape are disposed within a layer 130 positioned above a non-transient electronic device 150 with a semiconductor substrate 120. The layer 130 is shown in cutaway view to expose the containers. The containers 140 may be disposed throughout the layer and not visible in FIG. 2. As in FIG. 1, discrete electronic components including transistors 152 and diodes 151 connected via channels of a conductor material 155 are shown on the surface of the non-transient electronic device 150. Each container 140 may include the same agent or two or more unique agents. Containers 140 may be configured to release their contained agent individually or in some combination. Release of an agent can thereby be targeted to specific portions of the non-transient electronic device 150 or specific discrete electronic components or integrated circuits therein. Accordingly, functionality of the non-transient electronic device may occur in multiple stages wherein individual functions can be disabled or enabled separately. FIG. 2 further illustrates positioning of a non-transient electronic device 150 and a container 140 including an agent according to a method of the invention.

Figure 3:
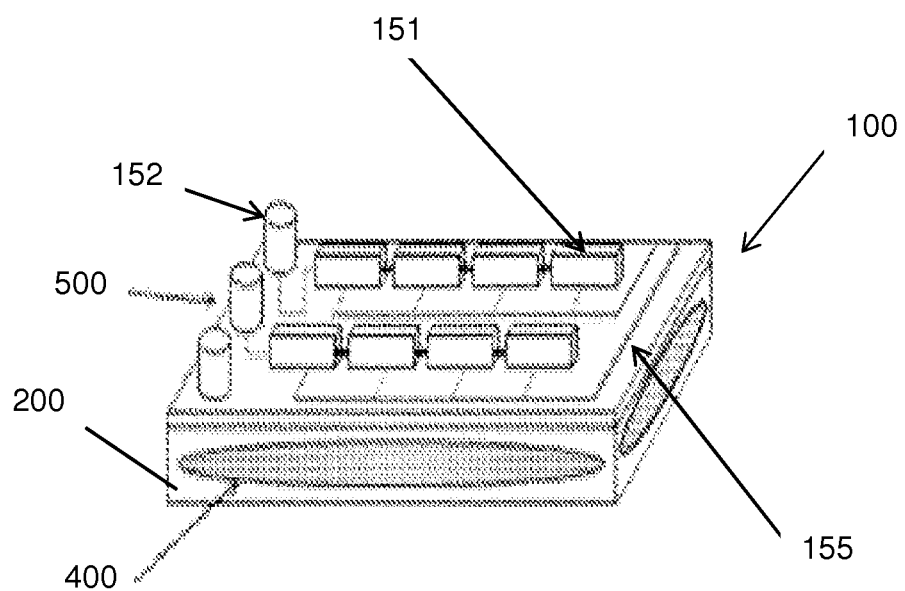
FIG. 3 shows a perspective view of a system of the present invention with an ellipse shaped container located within the substrate of a non-transient electronic device.
Figure 4:
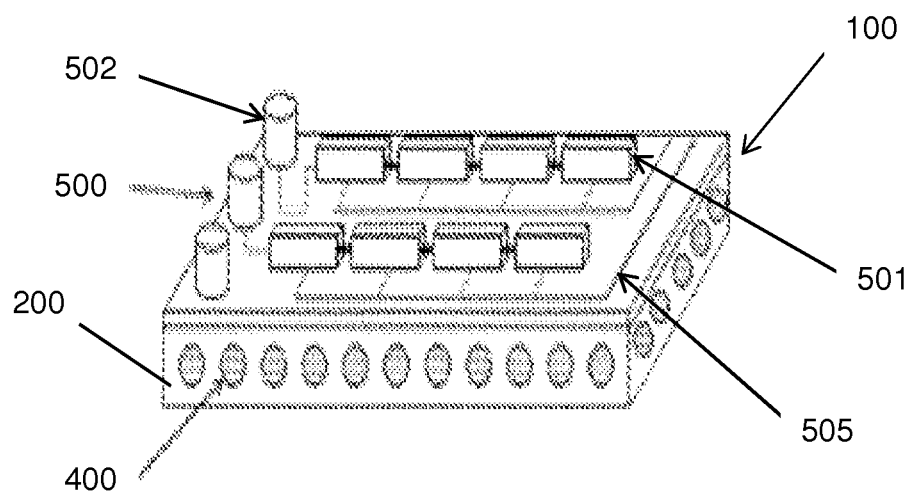
FIG. 4 shows a perspective view of a system of the present invention with several microcapsule containers located within the substrate of a non-transient electronic device.

FIG. 3 depicts an embodiment of a system 100 or method of the invention wherein a single, ellipsoid shaped container 400 including an agent is disposed within a bottom support or substrate 400 of a non-transient electronic device 500. The substrate 400 is shown in cutaway to show the container 400 within. One or more containers may be disposed within a substrate and may take a variety of shapes and sizes. FIG. 4 illustrates an embodiment wherein multiple microsphere containers 400 are disposed throughout a substrate 200 which is shown in cutaway. Similar to the embodiment depicted in FIG. 2, the configuration shown in FIG. 4 may be used for a targeted release of agent.

Figure 5:
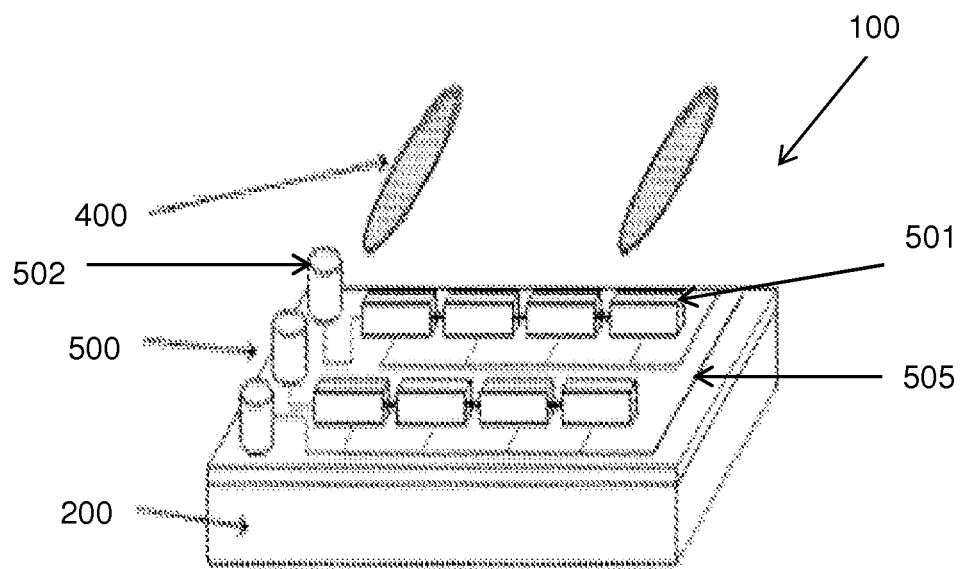
FIG. 5 shows an exploded perspective view of a system of the present invention with elongated tube-shaped containers above a non-transient electronic device.
Figure 6:
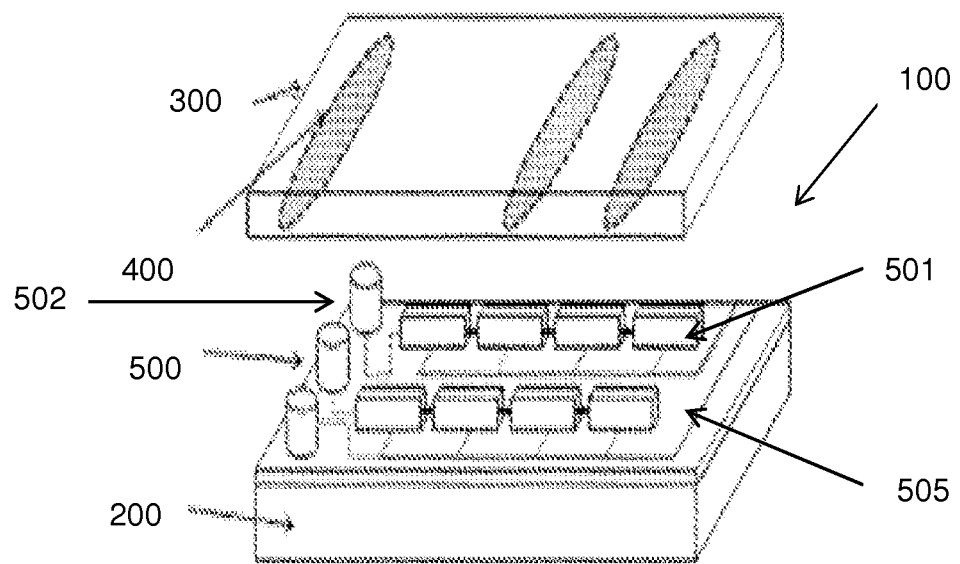
FIG. 6 shows an exploded perspective view of a system of the present invention with elongated tube-shaped containers located in a layer above a non-transient electronic device.

FIGS. 5 and 6 illustrate embodiments of systems and methods of the present invention wherein multiple microtube shaped containers 400 holding one or more agents are positioned above a non-transient electronic device. As shown in FIGS. 5 and 6, different containers may be positioned above specific areas or components of the non-transient electronic device 500 including discrete electronic components such as transducers 502 or diodes 501 in order to enable targeted release of an agent as described earlier.

Containers may be a variety of shapes and sizes. In certain embodiments a container may surround the electronic device. The size and shape of a container, will depend on the non-transient electronic device in the application. For example, a container, may generally conform in shape and size to the non-transient electronic device. Alternatively and as noted above, one or more containers may be configured to release an agent only to a portion of a non-transient electronic device. For example, in embodiments wherein some functions of the non-transient electronic device are disabled while others are left intact or enabled, the container may be sized, shaped, and positioned so that the released agent will only target and effect the specific area of the device associated with the function to be altered. Systems and methods of the invention may also utilize a combination of containers of various shapes and sizes.

The containers are constructed of one or more materials that are suitable to both contain the agent and release the agent. That is, each of the containers must be constructed and configured to be chemically stable to the contained agent for at least some period of time, such that the agent contained therein is not released until desired. In certain embodiments, the container may be constructed of a material that is reactive with the agent wherein the agent erodes the container over time and is thereby passively released. By manipulating the composition of the agent and the composition and thickness of the material of the container, erosion of the container and subsequent release of the agent can be programmed to occur after a preselected amount of time. Exemplary materials for the container include but are not limited to, polymers, plastics, glass, rubber, metal, or silk. In certain embodiments, the container may be formed as a pocket within a semiconductor material such as silicon wherein the interior surface of the container is the semiconductor material and is configured to be degraded by the agent over a predetermined amount of time so as to controllably release the agent to the rest of the non-transient electronic device as described above. Alternatively, the material of the container may degrade upon exposure to certain wavelengths of radiation or upon exposure to a certain substance such as water.

In embodiments where the containers are incorporated within the device, the containers may be constructed using the steps of the semiconductor device fabrication process described earlier. In other embodiments, containers may be constructed using techniques well known in the art such as injection molding, casting, or thermoforming. The agent may be encapsulated by the container during the forming process of the container or may be injected or otherwise introduced into the container after formation.

The agent used in a particular embodiment will be selected to impact the specific non-transient electronic device in the embodiment, or one or more portions thereof, in the desired manner. In certain embodiments, a single agent will be used while in other embodiments multiple agents may be isolated within separate containers. Selection of the agent will depend upon the application and may be based on considerations such as the material properties of the non-transient electronic device, the degree of physical alteration desired as well as user and/or environmental safety. Multiple agents may be used wherein each agent in isolation has no effect on the functionality of the non-transient electronic device but when combined, the agents alter the functionality. Alternatively, one agent may act to neutralize the transformative effects of another agent wherein release of the agents is staggered in order to limit the degree of transformation. Regardless of specific composition, at least one agent in a system or method of the invention acts to destroy or impair some or all of the functional operation of a non-transient electronic device, or to cause it to perform a different function after exposure to the agent.

An agent used in a system or method of the present invention can be a chemical etchant such as those used in traditional semiconductor fab processes. Chemical etchants work by eroding the surface of the target material, in the case of semiconductor fabrication the target material is a semiconductor material such as silicon. Electronic devices formed from silicon and other semiconductor materials rely on many small electronic circuits integrated onto a single substrate. These circuits may be defined and separated by minute channels in the semiconductor material. Therefore, removal of additional semiconductor material through a process such as etching can disrupt the complicated electronic components of an electronic device. In embodiments utilizing an etchant as an agent, the functionality of a non-transient electronic device may be altered through this process. A chemical etchant agent can have a low pH or a high pH. Various kinds of etchants can be used as an agent including for example, hydrochloric acid (HCl), hydrofluoric acid (HF), dilute HF (such as 51% deionized water and 49% HF), buffered HF (containing $NH_4F$ and HF), phosphoric acid, nitric acid, combinations of the foregoing, and others. Some possible high pH chemical etchants include tetramethylammonium hydroxide, alkali metal hydroxides, and strongly basic amines.

The agent may instead be an oxidant. By oxidizing the semiconductor material the agent may change its electronic properties and thereby disrupt the function of the non-transient electronic device. For example, the oxidized form of silicon, silicon dioxide, is utilized as an insulator in integrated circuits and oxidation of additional portions of silicon within a substrate may serve to disrupt the functionality of a non-transient electronic device. Alternatively, an oxidizing agent may be directed to a conductor material within the non-transient electronic device resulting in altered electrical properties and device function.

Figure 7:
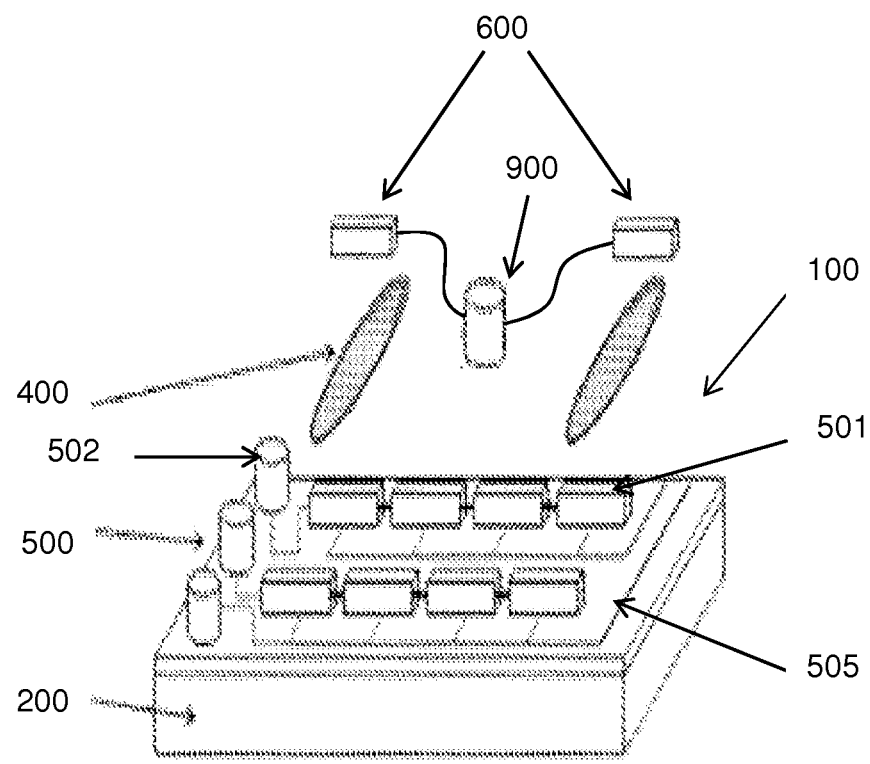
FIG. 7 shows an exploded perspective view of a system of the present invention with a RF transducer and a sensor.

Release of an agent from one or more containers to a non-transient electronic device may be initiated by a variety of methods. In certain embodiments, a system 100 may include a heating mechanism such as a radiofrequency (RF) transducer 600 as shown in FIG. 7. FIG. 7 further illustrates positioning of a non-transient electronic device 150, multiple containers 140 including one or more agents, a sensor 900 and multiple RF transducers 600 according to methods of the invention. Systems and methods of the invention may include a variety of different sensors configured to sense one or more parameters including but not limited to vibration, light, a change in biological environment, temperature, pressure, electromagnetic radiation, concentration of an analyte, electric or magnetic fields, pH, or voltage. Such sensors 900 may be in communication with an RF transducer 600 as shown in FIG. 7, an actuator, or other component which may in turn act on a container to trigger release of an agent and a corresponding functional alteration in the non-transient electronic device. RF energy may be focused on the container or the agent in order to precipitate release of the agent from the container. By heating the agent within a container, pressure may build in the container until the container is ruptured and the agent is released. Alternatively, the container may be constructed of a material configured to degrade when exposed to a certain level of heat wherein the release of the agent from the container may be triggered by RF or other energy directed to the container.

Figure 8:
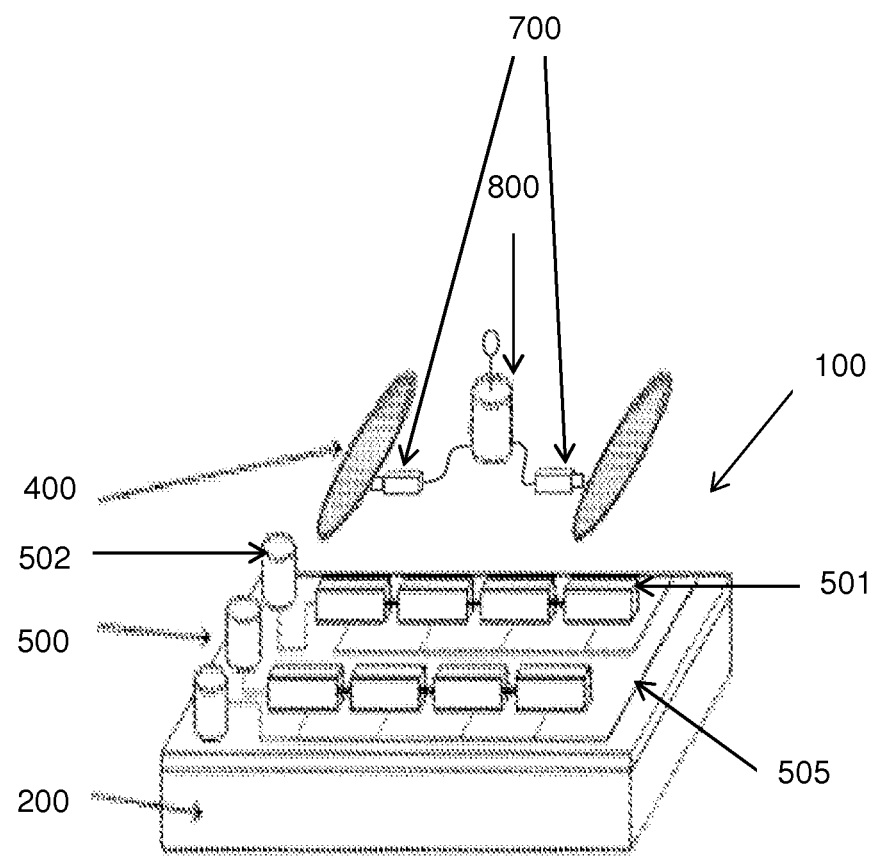
FIG. 8 shows an exploded perspective view of a system of the present invention with an actuator and a communication device.

In certain embodiments, the container may release the agent upon physical manipulation. The container can be constructed of a brittle material such as glass. In such instances, the container may be configured to release the agent when subjected to a threshold external force, such as the non-transient electronic device being dropped or upon attempts to deconstruct or tamper with the non-transient electronic device. FIG. 8 illustrates a system 100 and method of the invention wherein physical disruption of multiple containers 400 is utilized. The system and method depicted in FIG. 7 includes multiple actuators 600 configured to rupture multiple containers 400 when activated by a communication device 800 in communication with the actuators. Actuators, transducers, or other devices configured to initiate the release of the agent to the non-transient electronic device may be programmed to activate after a set amount of time or may be remotely activated. Methods and systems of the invention may include a receiver or other communication device 800 as shown in FIG. 8 whereby release of the agent may be triggered remotely upon receipt of a remote transmission. A communication device 800 may be in communication with an actuator 700 as shown in FIG. 8, an RF transducer, or other component which may in turn act on a container to trigger release of an agent and a corresponding functional alteration in the non-transient electronic device.

Various modifications of the invention and many further embodiments thereof, in addition to those shown and described herein, will become apparent to those skilled in the art from the full contents of this document. The subject matter herein contains important information, exemplification and guidance that can be adapted to the practice of this invention in its various embodiments and equivalents thereof.

The invention claimed is:

1. A system, comprising:
a non-transient electronic device capable of performing at least one function;
an agent capable of rendering the non-transient electronic device incapable of performing the at least one function; and
a container including the agent and configured to controllably release at least some of the agent to the non-transient electronic device.

2. The system of claim 1 wherein the container releases at least some of the agent to the non-transient electronic device when the container is heated.

3. The system of claim 1 wherein the container releases at least some of the agent to the non-transient electronic device when the agent is heated.

4. The system of claim 2 wherein the heat is produced by applying radiofrequency (RF) energy.

5. The system of claim 3 wherein the heat is produced by applying radiofrequency (RF) energy.

6. The system of claim 1 wherein the container releases at least some of the agent to the non-transient electronic device when the container is subjected to mechanical disruption.

7. The system of claim 1 wherein the agent comprises a chemical etchant.

8. The system of claim 1 wherein the agent comprises an oxidant.

9. The system of claim 1 wherein the container comprises one or more microspheres, microtubes, or microcapsules with an amount of the agent within each of the microspheres, microtubes, or microcapsules.

10. The system of claim 1 wherein the container surrounds the non-transient electronic device.

11. The system of claim 1 wherein the container comprises a layer disposed within, on, or near the non-transient electronic device.

12. The system of claim 1 wherein the container comprises one or more materials that release at least some of the agent after a predetermined amount of time, and wherein the system thus is passive.

13. The system of claim 1 wherein the container releases at least some of the agent in response to an external trigger, and wherein the system thus is active.

14. The active system of claim 13 wherein the external trigger is vibration, light, a change in biological environment, a change in temperature, a change in pressure, exposure to electromagnetic radiation, contact with a chemical agent, application of an electric field, application of a magnetic field, exposure to a solvent, a change in pH of an external environment, a change in salt concentration of an external environment, or application of an anodic voltage.

15. The system of claim 1 wherein the at least one function that the non-transient electronic device is capable of performing comprises storing data or instructions.

16. The system of claim 1 wherein the at least one function that the non-transient electronic device is capable of performing comprises processing data or instructions.

17. A method for constructing a system comprising:
providing a non-transient electronic device capable of performing at least one function;
providing a container configured to controllably release at least some of a contained agent, said agent capable of rendering the non-transient electronic device incapable of performing the at least one function; and
positioning the non-transient electronic device and the container to allow at least some of the agent to contact the non-transient electronic device upon being released from the container.

18. The method of claim 17 further comprising:
providing an energy delivery device capable of controllably providing a form of energy to another object; and
positioning the energy delivery device and the container so that, when activated, the energy delivery device provides energy to the container or the contained agent.

19. The method of claim 18 wherein the form of energy is heat.

20. The method of claim 18 wherein the form of energy is radiation.

21. The method of claim 18 wherein the energy delivery device is an actuator and the form of energy is kinetic.

22. The method of claim 17 wherein the agent comprises a chemical etchant or an oxidant.

23. The method of claim 17 wherein the container comprises one or more microspheres, microtubes, or microcapsules with an amount of the agent within each of the microspheres, microtubes, or microcapsules.

24. The method of claim 17 wherein the container is configured to at least partially envelope the non-transient electronic device and further comprising at least partially enveloping the non-transient electronic device with the container.

25. The method of claim 17 further comprising incorporating the container into a layer of the non-transient electronic device.

26. The method of claim 17 further comprising selecting a container comprised of one or more degradable materials configured to release at least some of the agent after a predetermined amount of time wherein release of the agent to the non-transient electronic device thus is passive.

27. The method of claim 17 further comprising providing a triggering mechanism configured to cause the container to release at least some of the agent in response to a signal.

28. The method of claim 27 further comprising providing a sensor capable of sensing a parameter value and enabling communication between the sensor and the triggering mechanism so that the sensor is capable of sending the signal to the triggering mechanism upon sensing a threshold parameter value.

29. The method of claim 28 wherein the parameter value is vibration, light, a change in biological environment, a change in temperature, a change in pressure, exposure to electromagnetic radiation, contact with a chemical agent, application of an electric field, application of a magnetic field, exposure to a solvent, a change in pH of an external environment, a change in salt concentration of an external environment, or application of an anodic voltage.

30. The method of claim 27 further comprising providing a communication device capable of receiving a remote transmission and enabling communication between the communication device and the triggering mechanism so that the communication device is capable of sending the signal to the triggering mechanism upon receipt of the remote transmission.

31. The method of claim 30 wherein the communication device is a wireless receiver or transceiver.

32. The method of claim 30 wherein the communication device is configured to transmit a communication when the non-transient electronic device has been rendered incapable of performing the at least one function.

* * * * *